(12) United States Patent
Cheng et al.

(10) Patent No.: US 8,370,691 B1
(45) Date of Patent: Feb. 5, 2013

(54) TESTING OF SOFT ERROR DETECTION LOGIC FOR PROGRAMMABLE LOGIC DEVICES

(75) Inventors: Chan-Chi Jason Cheng, Fremont, CA (US); Qin Wei, San Jose, CA (US); Ting Yew, San Jose, CA (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 13/299,507

(22) Filed: Nov. 18, 2011

Related U.S. Application Data

(63) Continuation of application No. 11/760,411, filed on Jun. 8, 2007, now Pat. No. 8,065,574.

(51) Int. Cl.
*G01R 31/28* (2006.01)
*G11C 29/00* (2006.01)
*G06F 11/00* (2006.01)

(52) U.S. Cl. .................... 714/725; 714/723; 714/736

(58) Field of Classification Search .................... None
See application file for complete search history.

(56) References Cited

U.S. PATENT DOCUMENTS

| | | | | |
|---|---|---|---|---|
| 4,495,603 | A * | 1/1985 | Varshney ............... | 365/233.11 |
| 5,650,734 | A * | 7/1997 | Chu et al. ............... | 326/38 |
| 5,705,938 | A * | 1/1998 | Kean ...................... | 326/39 |
| 5,805,789 | A * | 9/1998 | Huott et al. ............. | 714/6.32 |
| 5,826,032 | A * | 10/1998 | Finn et al. ................ | 709/236 |
| 5,869,980 | A * | 2/1999 | Chu et al. ............... | 326/38 |
| 6,049,487 | A * | 4/2000 | Plants et al. ............ | 365/189.04 |
| 6,088,817 | A * | 7/2000 | Haulin .................... | 714/42 |
| 6,101,624 | A * | 8/2000 | Cheng et al. ........... | 714/736 |
| 6,202,182 | B1 * | 3/2001 | Abramovici et al. ... | 714/725 |
| 6,237,124 | B1 * | 5/2001 | Plants ..................... | 714/763 |
| 6,438,738 | B1 * | 8/2002 | Elayda .................... | 716/117 |
| 6,741,515 | B2 * | 5/2004 | Lazar et al. ............. | 365/222 |
| 6,874,107 | B2 * | 3/2005 | Lesea ...................... | 714/725 |
| 6,944,836 | B1 * | 9/2005 | Lai .......................... | 716/136 |
| 7,036,059 | B1 * | 4/2006 | Carmichael et al. .... | 714/725 |
| 2005/0071730 | A1 * | 3/2005 | Moyer et al. ............ | 714/758 |

OTHER PUBLICATIONS

Lu Zhao; Huber, J.; , "Design and multiple trellis decoding for concatenated constant envelope non-orthogonal space-time block codes," Telecommunications, 2003. ICT 2003. 10th International Conference on , vol. 2, no., pp. 1184-1188 vol. 2, Feb. 23-Mar. 1, 2003.*

* cited by examiner

*Primary Examiner* — Cynthia Britt
*Assistant Examiner* — Daniel McMahon

(57) ABSTRACT

In one embodiment, a programmable logic device (PLD) with configuration memory includes at least one configuration memory cell and soft error detection (SED) logic for checking for errors in data stored by the configuration memory. The SED logic calculates a present data value for the configuration memory for comparison with a pre-calculated data value. A fuse within the PLD is configurable in a first logic state to enable the SED logic to read from the configuration memory cell in calculating the present data value and configurable in a second logic state to prevent the SED logic from reading from the configuration memory cell in calculating the present data value. The SED logic may be tested for correct operation by writing data representing a soft error into the configuration memory cell and enabling the SED logic to read from the configuration memory cell in calculating the present data value.

16 Claims, 4 Drawing Sheets

TESTING OF SOFT ERROR DETECTION LOGIC FOR PROGRAMMABLE LOGIC DEVICES

RELATED APPLICATION DATA

This application is a continuation of U.S. application Ser. No. 11/760,411, filed Jun. 8, 2007, now U.S. Pat. No. 8,065,574, which is incorporated herein by reference in its entirety.

TECHNICAL FIELD

The present invention relates generally to electrical circuits and, more particularly, to testing memory and associated logic within programmable logic devices.

BACKGROUND AND SUMMARY

A soft error upset (SEU), also known as a single event upset, refers generally to a change of state or a transient induced in one or more signal values in a semiconductor device (e.g., when struck by an ionizing particle, such as a neutron or an alpha particle). For example, a programmable logic device (PLD), such as a field programmable gate array (FPGA) or a complex PLD (CPLD), is configured by data stored in configuration memory cells (e.g., SRAM cells), which are susceptible to SEUs that change the originally programmed data state (e.g., programmed a "1" but SEU changes value to "0"). One or more SEUs within the PLD may be particularly noticeable because the data stored in the configuration memory cells determines the PLD's functionality.

Consequently, for example, a conventional PLD typically includes soft error detection (SED) logic (e.g., soft error intellectual property (IP)) that will read the configuration memory cells, such as in the background of a user mode of operation, and calculate a cyclic redundancy code (CRC) value to compare with a pre-calculated CRC value (e.g., CRC checksum). If the CRC values match, then there is no error in the values stored in the configuration memory cells. However, if the CRC values do not match, an error flag may be provided, which may for example trigger a reconfiguration of the PLD.

To test the SED logic's ability to detect a soft error (e.g., SED logic functionality), a typical procedure is to simulate a soft error in the PLD (as it is may be difficult to produce a real soft error in the hardware). For example, associated logic may be provided to the SED logic to simulate a soft error from one or more configuration memory cells, such as by changing a data value after it has been read from the configuration memory cell but before the CRC calculation is performed. However, the simulated soft error is not a true soft error condition and thus, may not accurately simulate and properly emulate a real (i.e., true) soft error, such as for example with respect to timing or other considerations.

As a result, there is a need for improved techniques for testing SED logic of programmable logic devices.

In one embodiment of the invention, a programmable logic device (PLD) includes configuration memory including a configuration memory cell; soft error detection (SED) logic adapted to check for an error in data stored by the configuration memory including the configuration memory cell by calculating a present data value for the configuration memory for comparison with a pre-calculated data value for the configuration memory; and a fuse configurable in a first logic state to enable the SED logic to read from the configuration memory cell in calculating the present data value of the configuration memory and configurable in a second logic state to prevent the SED logic from reading from the configuration memory cell in calculating the present data value.

In another embodiment of the invention, a method of testing SED logic for correct operation within a PLD includes writing data representing a soft error to a configuration memory cell with the configuration memory; and, with the SED logic, reading data stored in the configuration memory including the configuration memory cell; calculating from the read data a present data value for the configuration memory; and comparing the present data value with a pre-calculated data value for the configuration memory that does not include the soft error data written to the configuration memory cell. The SED logic is operating correctly if the present data value does not match the pre-calculated data value.

The scope of the invention is defined by the claims, which are incorporated into this section by reference. A more complete understanding of embodiments of the present invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Embodiments of the present invention and their advantages are best understood by referring to the detailed description that follows. It should be appreciated that like reference numerals are used to identify like elements illustrated in one or more of the figures.

DETAILED DESCRIPTION

Figure 1:
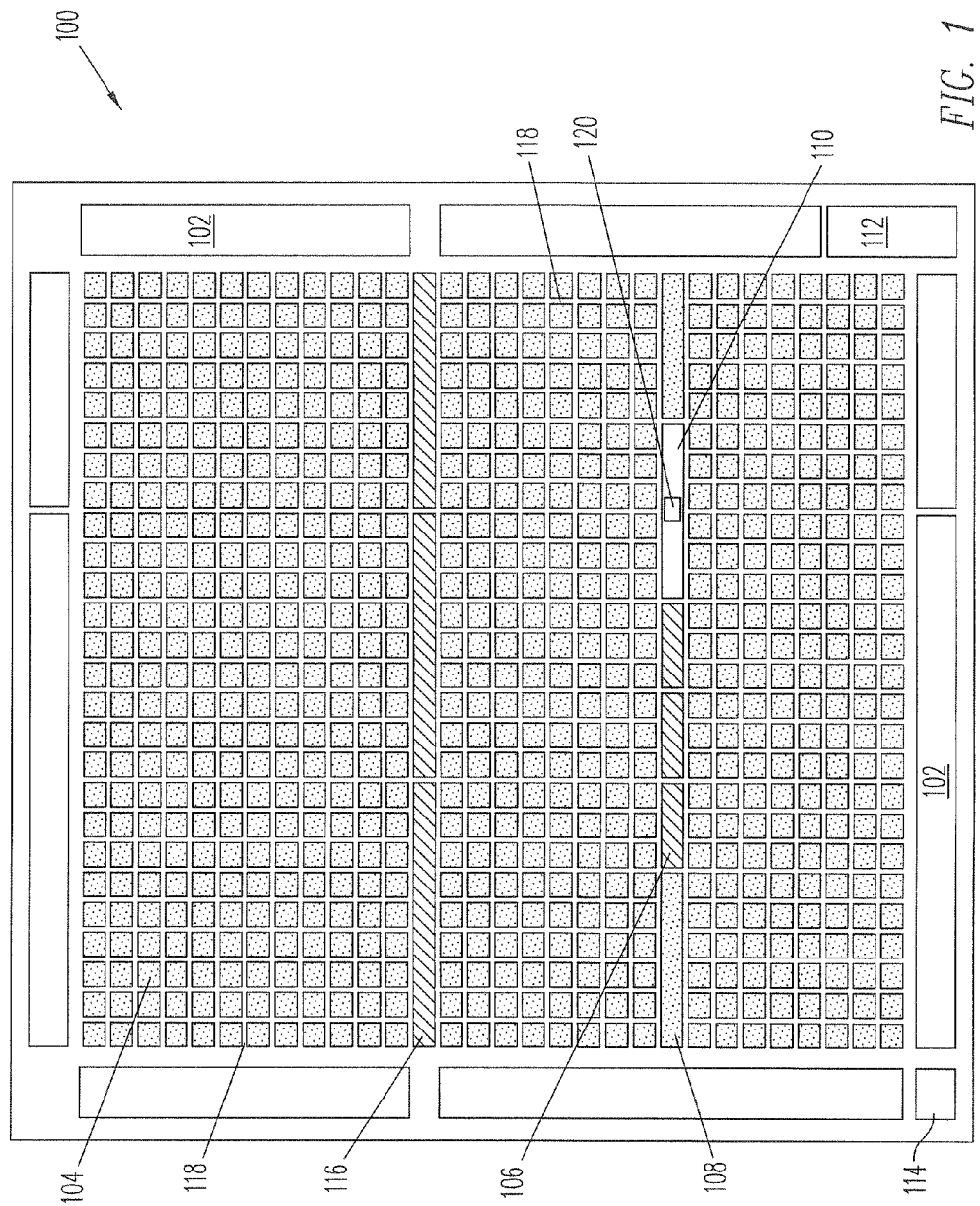
FIG. 1 shows a block diagram illustrating a programmable logic device in accordance with an embodiment of the present invention.

FIG. 1 shows a block diagram illustrating a programmable logic device (PLD) 100 in accordance with an embodiment of the present invention. PLD 100 (e.g., an FPGA, a CPLD, or a field programmable system on a chip (FPSC)) includes input/output (I/O) blocks 102, logic blocks 104 (e.g., also referred to as programmable logic blocks (PLBs), configurable logic blocks (CLBs), logic array blocks (LABs), programmable functional units (PFUs), or programmable logic cells (PLCs)), and configuration logic 110 (e.g., for startup, encryption, and/or error detection). I/O blocks 102 provide I/O functionality (e.g., supports one or more I/O and/or memory interface standards) for PLD 100, while programmable logic blocks 104 provide logic functionality (e.g., LUT-based logic) for PLD 100. Configuration logic 110 provides the general configuration functions for PLD 100, which may include for example controlling the loading of configuration data along with encryption and/or decryption of the configuration data (e.g., such as during start up, programming, or reconfiguration) and error detection (soft error detection logic) to detect errors in the configuration data stored in PLD 100, as would be understood by one skilled in the art.

PLD 100 may also include blocks of memory 106 (e.g., blocks of EEPROM, block SRAM, and/or flash memory), clock-related circuitry 108 (e.g., PLL and/or DLL circuits), a configuration port 112, configuration memory 114, special function blocks 116 (e.g., DSP blocks or other forms of multiply and accumulate circuit functionality), and/or routing resources 118 (e.g., a conventional general interconnect routing fabric).

Configuration port 112 may be optionally implemented and used for programming memory 106 and/or configuration memory 114 of PLD 100 as would be understood by one skilled in the art. For example, configuration port 112 may include a programming port, such as a central processing unit (CPU) port (also referred to as a peripheral data port or a sysCONFIG programming port) and/or a programming port such as a joint test action group (JTAG) port (e.g., by employing standards such as Institute of Electrical and Electronics Engineers (IEEE) 1149.1 or 1532 standards). Configuration port 112 typically may be included to receive configuration data and commands.

It should be understood that the number and placement of the various elements, such as I/O blocks 102, logic blocks 104, memory 106, clock-related circuitry 108, configuration logic 110, configuration port 112, configuration memory 114, special function blocks 116, and routing resources 118, is not limiting and may depend upon the desired application. For example, special function blocks 116 are optional as are various other elements (e.g., memory 106) and may not be required for a desired application. Furthermore, it should be understood that the elements are illustrated in block form for clarity and that certain elements, such as configuration memory 114 for example, would typically be distributed throughout PLD 100, such as in and between logic blocks 104, to perform their conventional functions (e.g., storing configuration data that configures PLD 100).

PLD 100, as discussed herein, includes SED logic 120 (e.g., within configuration logic 110 as shown) that will monitor configuration memory 114 to detect for SEUs or other types of data errors. For example, PLD 100 may read back configuration memory 114 to perform a CRC calculation and comparison operation to a pre-calculated CRC value using SED logic 120. In accordance with one or more embodiments of the present invention, PLD 100 may also test SED logic 120 to verify correct operation by changing one or more configuration memory data values and then comparing to the previously stored expected value (e.g., based on CRC operations) to properly simulate (emulate) true SEUs associated with configuration memory 114.

Figure 2:
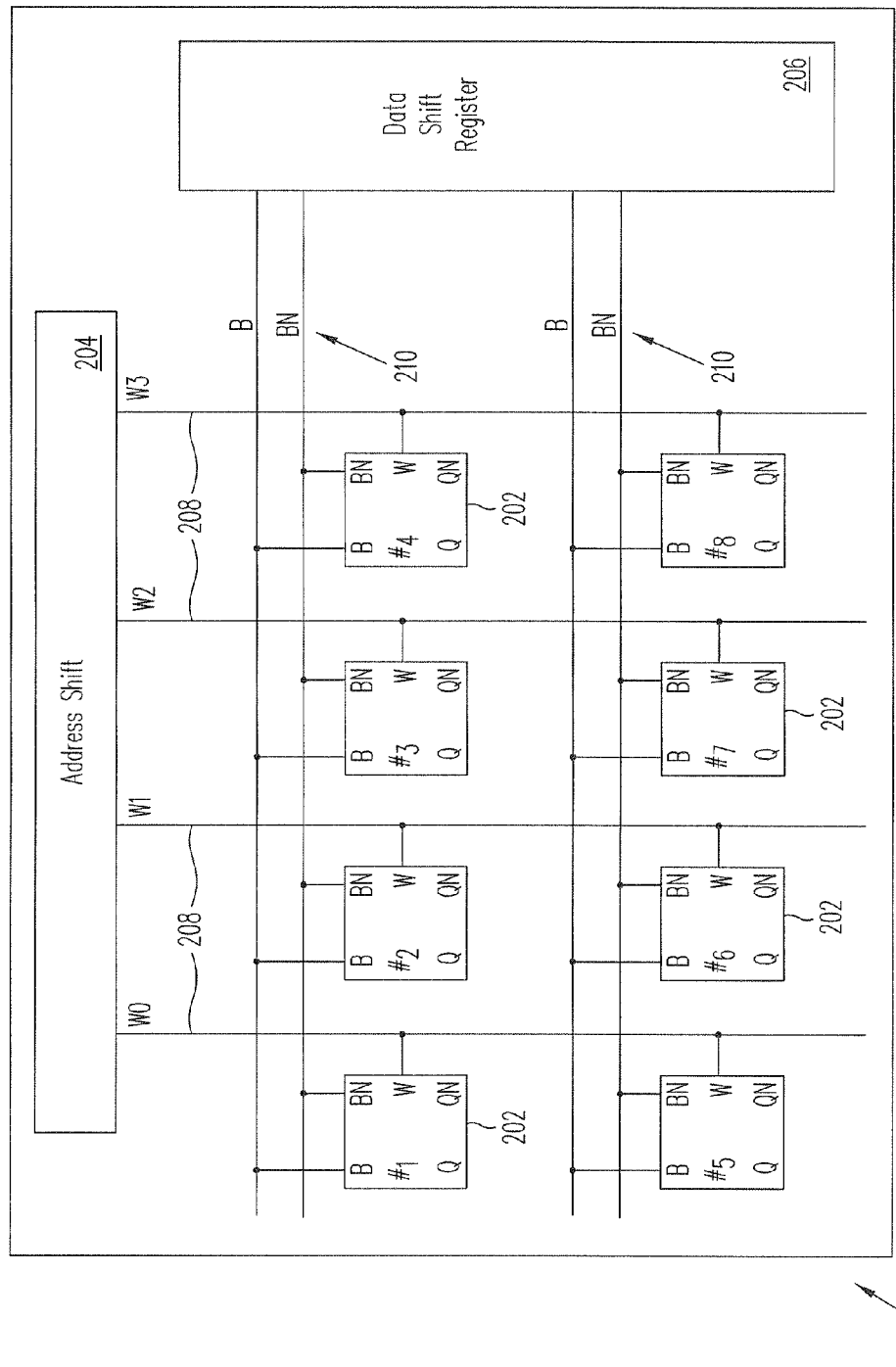
FIG. 2 shows a block diagram illustrating a programmable logic device in accordance with an embodiment of the present invention.

For example, FIG. 2 shows a block diagram illustrating a PLD 200 in accordance with an embodiment of the present invention. PLD 200 may represent a portion of PLD 100 (FIG. 1) to illustrate, as a specific implementation example, the reading and writing of configuration memory 114 and the testing of SED logic 120. PLD 200 includes configuration memory cells 202 (e.g., eight SRAM cells of configuration memory 114), an address shift register (ASR) 204, and a data shift register (DSR) 206. ASR 204 and DSR 206 may be viewed as an example of read/write circuitry for programming configuration memory cells 202 and reading back configuration memory cells 202 (e.g., during a user mode of operation).

Configuration memory cells 202 may be arranged in a two-dimensional fashion (e.g., within routing resources 118, logic blocks 104, and other parts of PLD 100) and may number in the thousands or millions, but for clarity only two rows and four columns (e.g., partial rows and columns) of configuration memory cells 202 are shown. Configuration memory cells 202 may represent SRAM cells or any other type of volatile or non-volatile memory, depending upon the desired application, as would be understood by one skilled in the art.

ASR 204 controls wordlines 208 (e.g., labeled W0 through W3), while DSR 206 controls bitlines 210 (e.g., complementary bitlines labeled B and BN). As a conventional programming example, ASR 204 drives a logical low signal on wordlines 208, while DSR 206 drives a data signal for one column on bitlines 210 (i.e., complementary data signals on B and BN). ASR 204 then drives a logical high signal on one wordline 208 (e.g., wordline 208 labeled W0), while maintaining the logical low signal on the remaining wordlines 208 so that the data on bitlines 210 is written into configuration memory cells 202 associated with the one wordline 208 (wordline 208 labeled W0). After the data is written for the one column, ASR 204 drives a logical low signal on wordlines 208 and the process repeats for each column of data to be written.

After the configuration data is programmed into configuration memory cells 202, PLD 200 begins its normal operation (often referred to as "user mode") to perform the logic functions and operate as intended for the particular design. Typically, during user mode, ASR 204 maintains a logical low signal on wordlines 208 and DSR 206 maintains a logical high signal on bitlines 210. The data may also be read out of configuration memory cells 202 during a user mode of operation via DSR 206 by controlling DSR 206 and ASR 204 in a similar fashion as discussed above, as would be understood by one skilled in the art, and as discussed further herein.

In general with respect to conventional approaches, the configuration memory is read during a user mode of operation (e.g., in the background to check for SEUs). If a manufacturer, for example, desires to test the SED logic's ability to detect a SEU, a typical procedure is to simulate a soft error in the PLD such as through additional logic provided to introduce an error into the data to be checked by the SED logic after the data has been read from the configuration memory. However, as noted above, such a simulated soft error may not accurately simulate and properly emulate a real (i.e., true) soft error being read from the configuration memory.

In contrast in accordance with one or more embodiments of the present invention, a data value stored in one or more of the configuration memory cells may be changed (e.g., to a predetermined value during a user mode of operation) so that the SED logic may be properly tested (e.g., verify that the SED logic detects the changed data value as an SEU). Specifically for example, configuration memory (e.g., of lookup tables within logic blocks 104), which may be used as distributed memory during a user mode of operation, may be used to test SED logic 120 by intentionally changing the stored data value in one or more of these configuration memory cells and monitoring SED logic 120 to determine whether the simulated SEU is detected.

Figure 3:
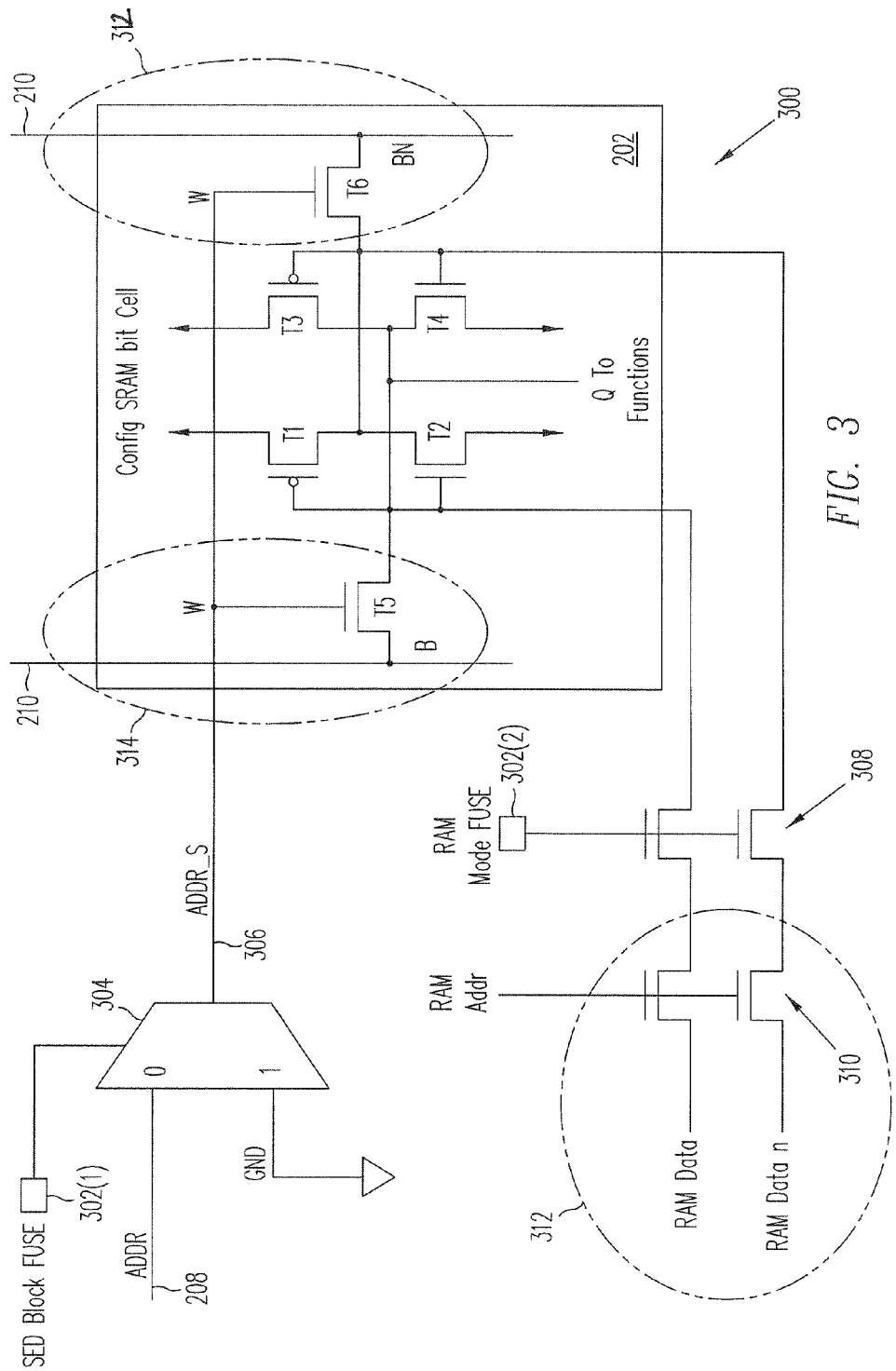
FIG. 3 shows a block diagram illustrating a programmable logic device in accordance with an embodiment of the present invention.

As an example, FIG. 3 shows a circuit diagram illustrating a PLD 300 in accordance with an embodiment of the present invention. PLD 300 may represent a portion of PLD 200 (FIG. 2) to illustrate, as a specific implementation example, techniques for testing of SED logic 120. For example for clarity, PLD 300 is shown with one configuration memory cell 202 (e.g., one configuration SRAM cell), but the techniques disclosed herein may be applied to any number of configuration memory cells as would be understood by one skilled in the art.

Configuration memory cell 202 may represent, for example, a memory cell of a lookup table within logic block 104 (FIG. 1), with the memory cell optionally available for use as distributed memory within PLD 300. For example, configuration memory cell 202 may provide a first port 314

(indicated generally by circled regions identified as first port 314), for reading from or writing to configuration memory cell 202 via bitlines 210, and a second port 312 (indicated generally by a circled region identified as second port 312), an example of a read/write circuit for reading from or writing to configuration memory cell 202 as random access memory.

First port 314 couples to DSR 206 (not shown) via bitlines 210, as discussed in reference to FIG. 2, for programming configuration memory cell 202 and reading from configuration memory cell 202 (e.g., reading in the background during a user mode of operation, such as for checking for SEUs by the SED logic). Second port 312 couples to circuitry within PLD 300 (e.g., to other logic blocks 104) to use configuration memory as random access memory during user mode of operation, as would be understood by one skilled in the art.

In conventional approaches, the data value stored by configuration memory cell 202, if used as distributed memory, would be unable to be read by the SED logic. For example, first port 314 would be prevented (e.g., associated wordline 208 held low) from providing the data value stored in configuration memory cell 202 and thus, during read back for the SED logic, a certain data value (e.g., a constant) would be provided (e.g., by DSR 206) for use by the SED logic regardless of the data value stored in configuration memory cell 202 (i.e., the SED logic would not include the distributed memory data for the SEU test).

In contrast and in accordance with some embodiments of the present invention, configuration memory cell 202, when functioning in distributed memory mode, may be used to test SED logic 120. For example, the actual data value stored in configuration memory cell 202, in distributed memory mode, may be provided to SED logic 120. Thus, during user mode of operation, the data value may be changed (e.g., to a predetermined value) and then read to test SED logic 120 for proper operation (e.g., detection of the simulated SEU as represented by the change in the data value of configuration memory cell 202).

As a specific implementation example, PLD 300 (FIG. 3) illustrates a circuit implementation for testing the SED logic. Switches 308 are switched on by a RAM mode signal (labeled RAM Mode Fuse) if configuration memory cell 202 is to be used as distributed memory (e.g., distributed memory mode) to provide the ability to read and write data through second port 312. The RAM mode signal, for example, may be a global signal or provided on an individual configuration memory cell lookup table basis. Switches 310 are controlled by a RAM address signal (labeled RAM Addr) to control read/write addressing through second port 312 of configuration memory cell 202 during a user mode of operation as would be understood by one skilled in the art. As an example, fuse 302(2) (e.g., configuration memory cell of configuration memory 114 of FIG. 1) may be employed to provide the RAM mode signal.

During a normal (conventional) SED logic read back test of configuration memory cell 202, an associated wordline 306 (labeled ADDR_S) is held low to prevent the data value stored in configuration memory cell 202 from being read (as discussed above for the conventional SED logic operation). However, to test SED logic 120, for example, wordline 306 is held high (first port 314 enabled) to allow the read back via bitlines 210 of the data value stored in configuration memory cell 202 (e.g., the distributed memory data value). Thus, as an example, the data value stored in configuration memory cell 202 may be changed to a different value than used for the pre-calculated CRC value so that the calculated CRC value of SED logic 120 will differ and serve as a test of the SED logic's ability to detect a true SEU.

The logic for controlling wordline 306 (e.g., representing one of wordlines 208 of FIG. 2) may be implemented within ASR 204 or external to ASR 204. For example as shown in FIG. 3, a multiplexer 304 may be controlled with a multiplexer control signal (e.g., provided by fuse 302(1) and labeled SED block fuse) to select either a logical low value (e.g., ground) to prevent read back via first port 314 or to select an address signal (labeled ADDR) on wordline 208, which may provide a logical high value to enable read back via first port 314. Multiplexer 304, for example, may be incorporated into ASR 204.

In general for example, to test SED logic 120, a user of PLD 300 may select one or more of the configuration memory cells 202 for testing purposes. Thus, this logic and circuitry within PLD 300 may be implemented for all, one, or a few of configuration memory cells 202 that may be used as RAM during a user mode of operation. For example, only a few of configuration memory cells 202 may be provided with the capability to test the SED logic, as discussed herein.

Figure 4:
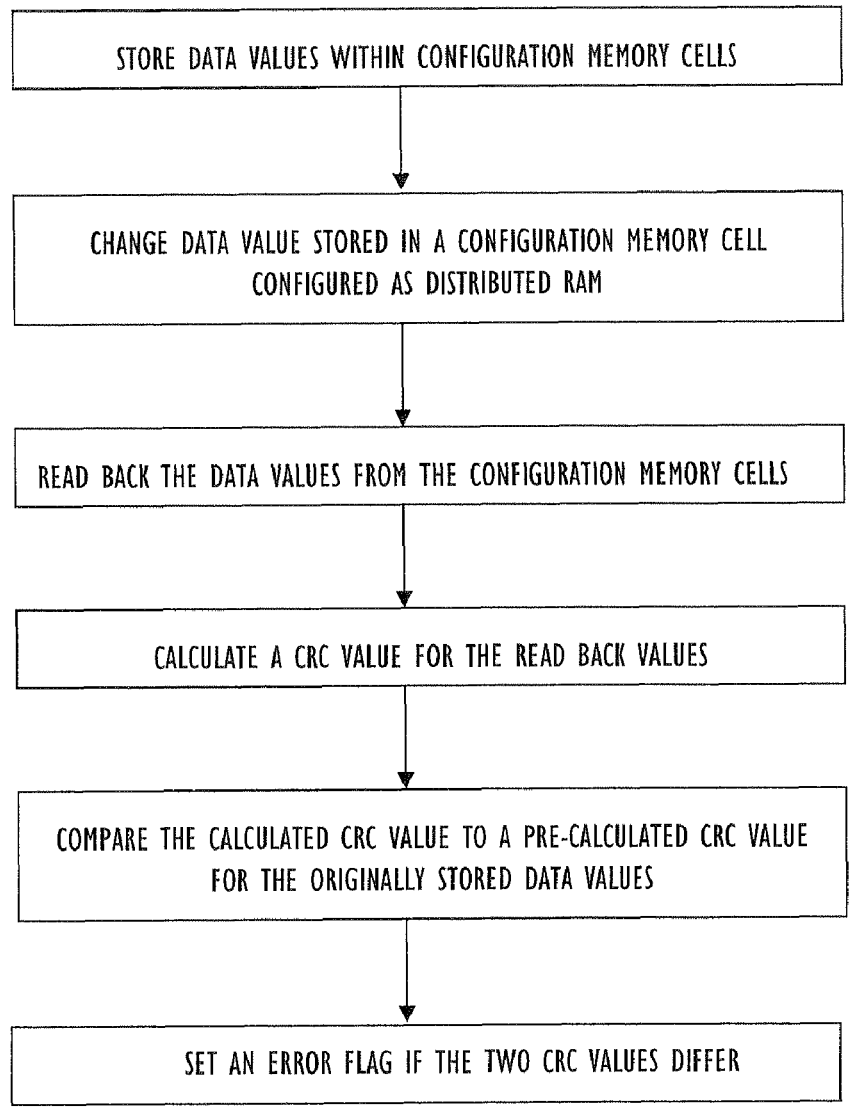
FIG. 4 is a flowchart illustrating a method for testing SED logic within a programmable logic device in accordance with an embodiment of the present invention.

During a normal SED logic read back test, configuration memory cells 202 operating as distributed memory will not be read back, but rather a constant will be provided (e.g., by DSR 206) in a conventional fashion, as discussed previously, and the resulting CRC value should match the pre-calculated CRC value (e.g., no error flag indicating no SEU). In contrast, a method of testing the SED logic according to the invention includes reading back data values from distributed memory. FIG. 4 illustrates an embodiment of the method. After writing a different data value (or previously programming with the different data value) into configuration memory cells 202 operating as distributed memory and designated for testing SED logic 120, this data value is then allowed to read back from these configuration memory cells 202 (e.g., through first port 314 and DSR 206) and provided to SED logic 120. Consequently, the calculated CRC value should differ from the pre-calculated CRC value, resulting in an SEU error flag to be set or other indication given of an SEU (simulated as discussed herein) and verifying that SED logic 120 is operating properly.

Systems and methods are disclosed herein to provide test techniques for SED logic for a programmable logic device. For example, in accordance with an embodiment of the present invention, techniques are disclosed for testing SED logic under a real soft error condition with correct timing, while not adding significantly to the hardware overhead (e.g., software based and may use existing fuses and distributed memory SRAM bits in logic block to emulate the soft error for testing purposes). For example, during a normal SED logic read back to check for SEUs, an SED block fuse (e.g., fuse 302(1)) is set (e.g., logical high value), wordlines to distributed RAM are tied to ground to disable read ports to DSR, and the SED logic ignores the user-controlled distributed RAM data values (e.g., using a forced constant provided by DSR for the SEU test). However for example, during an SED logic check to test the SED logic, the SED block fuse is not set (e.g., logical low value), the read ports to DSR are enabled to allow the SED logic to read back the user-controlled distributed RAM data values (instead of the DSR constant), and thus a "real" soft error may be detected by the SED logic (e.g., and provide an error flag) by proper selection of the data value written to the user-controlled distributed RAM.

Embodiments described above illustrate but do not limit the invention. It should also be understood that numerous modifications and variations are possible in accordance with the principles of the present invention. Accordingly, the scope of the invention is defined only by the following claims.

The invention claimed is:

1. A programmable logic device (PLD) comprising:
configuration memory including a configuration memory cell adapted to function as random access memory (RAM), the configuration memory cell having a first port for writing configuration data to the cell and a second port for writing RAM data to the cell;
soft error detection (SED) logic adapted to check for an error in data stored by the configuration memory including the configuration memory cell by calculating a present data value for the configuration memory for comparison with a pre-calculated data value for the configuration memory; and
a fuse configurable in a first logic state to enable RAM data from the configuration memory cell to be read through the first port for calculating the present data value of the configuration memory and configurable in a second logic state to prevent RAM data from being read from the configuration memory cell.

2. The PLD of claim 1 including:
an address shift register adapted to provide wordline signals on a wordline to the configuration memory cell; and
a multiplexer coupled between the address shift register and the wordline, the multiplexer having a first input coupled to the address shift register, a second input coupled to a second signal source, an output coupled to the wordline, and a select input coupled to the fuse,
wherein the multiplexer couples the address shift register to the wordline with the fuse configured in the first logic state to enable reading from the configuration memory cell through the first port and couples the second signal source to the wordline with the fuse configured in the second logic state to disable reading from the configuration memory cell through the first port.

3. The PLD of claim 1 including a second fuse configurable in a first logic state to enable RAM data to be written to the configuration memory cell through the second port and configurable in a second logic state to prevent RAM data from being written to the configuration memory cell through the second port.

4. The PLD of claim 1, wherein the SED logic is implemented within configuration logic of the programmable logic device.

5. The PLD of claim 1, wherein the SED logic is adapted to calculate a present cyclic redundancy code (CRC) value for comparison with a pre-calculated CRC value.

6. The PLD of claim 1, wherein the fuse is a configuration memory cell.

7. A programmable logic device (PLD) comprising:
configuration memory including a configuration memory cell adapted to function as random access memory (RAM), the configuration memory cell having a first port for writing configuration data to the cell and a second port for writing RAM data to the cell;
soft error detection (SED) logic adapted to check for an error in data stored by the configuration memory including the configuration memory; and
a fuse configurable in a first logic state to enable RAM data from the configuration memory cell to be read through the first port for checking for an error in the data and configurable in a second logic state to prevent RAM data from being read from the configuration memory cell.

8. The PLD of claim 7 including:
an address shift register adapted to provide wordline signals on a wordline to the configuration memory cell; and
a multiplexer coupled between the address shift register and the wordline, the multiplexer having a first input coupled to the address shift register, a second input coupled to a second signal source, an output coupled to the wordline, and a select input coupled to the fuse,
wherein the multiplexer couples the address shift register to the wordline with the fuse configured in the first logic state to enable reading from the configuration memory cell through the first port and couples the second signal source to the wordline with the fuse configured in the second logic state to disable reading from the configuration memory cell through the first port.

9. The PLD of claim 7 including a second fuse configurable in a first logic state to enable RAM data to be written to the configuration memory cell through the second port and configurable in a second logic state to prevent RAM data from being written to the configuration memory cell through the second port.

10. The PLD of claim 7, wherein the SED logic is implemented within configuration logic of the programmable logic device.

11. A method of testing soft error detection (SED) logic for correct operation within a programmable logic device (PLD), the PLD having configuration memory that includes a configuration memory cell, the method comprising:
writing data representing a soft error to the configuration memory cell; and
with the SED logic:
reading data stored in the configuration memory including the configuration memory cell;
calculating from the read data a present data value for the configuration memory; and
comparing the present data value with a pre-calculated data value for the configuration memory that does not include the soft error data written to the configuration memory cell,
wherein the SED logic is operating correctly if the present data value does not match the pre-calculated data value.

12. The method of claim 11 including, prior to the SED logic reading the data stored in the configuration memory cell, configuring the PLD from a second logic state to a first logic state to enable the SED logic to read from the configuration memory cell, wherein the SED logic is prevented from reading from the configuration memory cell in the second logic state.

13. The method of claim 12, wherein configuring the PLD includes configuring a fuse within the PLD from the second logic state to the first logic state.

14. The method of claim 11, wherein if the present data value does not match the pre-calculated data value, indicating a soft error has been detected.

15. The method of claim 11, wherein:
the configuration memory cell has first and second ports;
the data representing a soft error is written to the configuration memory cell through the second port; and
the data representing the soft error is read from the configuration memory cell through the first port.

16. The method of claim 15, wherein the configuration memory cell is adapted to function as random access memory (RAM), the first port adapted for writing configuration data to the cell and the second port adapted for writing RAM data to the cell.

* * * * *